US012261583B2

(12) United States Patent
Colasanti et al.

(10) Patent No.: US 12,261,583 B2
(45) Date of Patent: Mar. 25, 2025

(54) STACKED ACOUSTIC WAVE (AW) FILTER PACKAGES, INCLUDING CROSS-TALK REDUCTION LAYERS, AND RELATED FABRICATION METHODS

(71) Applicant: RF360 Singapore Pte. Ltd., Singapore (SG)

(72) Inventors: Simone Colasanti, Bayern (DE); Nadine Erhard-Egeler, Munich (DE); Stefan Leopold Hatzl, Kloech (AT); Manuel Hofer, Graz (AT); Peter Kirchhofer, Munich (DE); Volker Schulz, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 462 days.

(21) Appl. No.: 17/649,965

(22) Filed: Feb. 4, 2022

(65) Prior Publication Data

US 2023/0253950 A1    Aug. 10, 2023

(51) Int. Cl.
| | | |
|---|---|---|
| *H03H 9/02* | (2006.01) | |
| *H03H 3/08* | (2006.01) | |
| *H03H 9/10* | (2006.01) | |
| *H03H 9/64* | (2006.01) | |
| *H03H 9/72* | (2006.01) | |

(52) U.S. Cl.
CPC .......... *H03H 9/02913* (2013.01); *H03H 3/08* (2013.01); *H03H 9/1071* (2013.01); *H03H 9/1092* (2013.01); *H03H 9/6489* (2013.01); *H03H 9/725* (2013.01)

(58) Field of Classification Search
CPC .... H03H 9/02913; H03H 3/08; H03H 9/1071; H03H 9/1092; H03H 9/6489; H03H 9/725; H03H 9/0547; H03H 9/0566; H03H 9/105
USPC ................. 333/133, 186, 187, 188, 193–196
See application file for complete search history.

(56) References Cited

U.S. PATENT DOCUMENTS

| | | |
|---|---|---|
| 7,596,849 B1 | 10/2009 | Carpenter et al. |
| 10,250,219 B2 * | 4/2019 | Hatakeyama ........ H03H 9/1014 |
| 2011/0006381 A1 | 1/2011 | Feiertag et al. |
| (Continued) | | |

OTHER PUBLICATIONS

International Search Report and Written Opinion for International Patent Application No. PCT/US2023/060987, mailed May 16, 2023, 17 pages.

*Primary Examiner* — Jorge L Salazar, Jr.
(74) *Attorney, Agent, or Firm* — Withrow & Terranova, PLLC

(57) ABSTRACT

A stacked AW filter package includes a first substrate stacked on a second substrate. The first substrate has a first AW filter circuit on first surface and a metal layer on a second surface. The second substrate has a second AW filter circuit disposed in a cavity between the metal layer of the first substrate and a third surface of the second substrate. The metal layer is coupled to the second AW filter circuit by a metal interconnect formed in a metallization layer on a side surface of the first substrate. The metal layer provides isolation to reduce cross-talk (e.g., electromagnetic interference) within the stacked AW filter package between the first AW filter circuit and the second AW filter circuit. Including the metal layer in the stacked AW filter package improves signal quality of transmitted and received signals filtered in the first and second AW filter circuits.

30 Claims, 11 Drawing Sheets

(56) References Cited

U.S. PATENT DOCUMENTS

| | | |
|---|---|---|
| 2017/0179920 A1 | 6/2017 | Kawasaki |
| 2018/0026606 A1* | 1/2018 | Takata .................. H04L 5/1461 370/278 |
| 2018/0269849 A1 | 9/2018 | Matsumoto et al. |
| 2020/0313647 A1 | 10/2020 | Inoue |

* cited by examiner

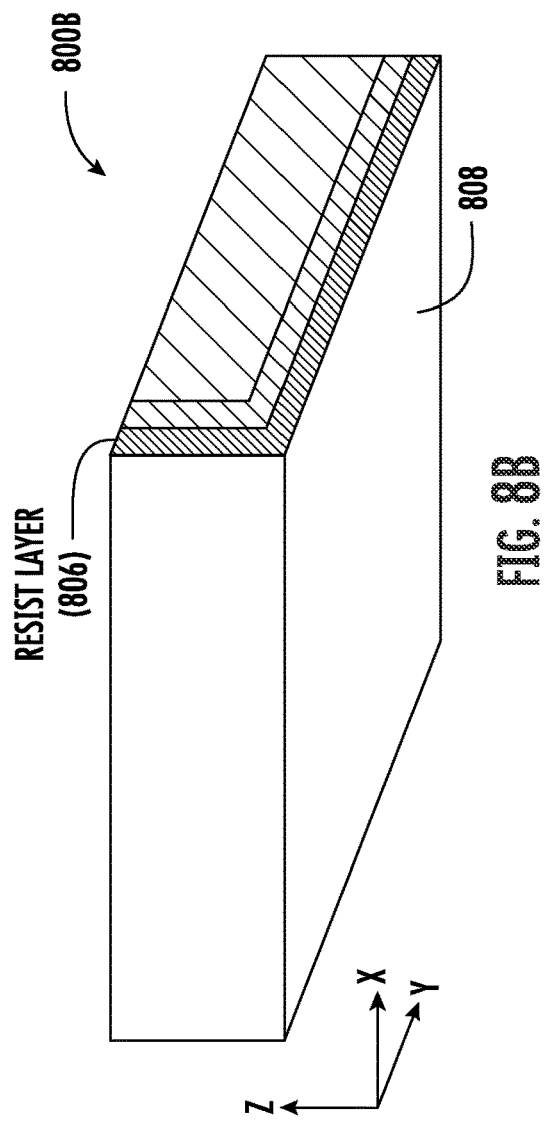

DISPOSE A PATTERNED MASK (810) ON THE RESIST LAYER (806) AND DEVELOP THE RESIST LAYER (806) IN EXPOSED AREAS (812) EXPOSED BY THE PATTERNED MASK (810)

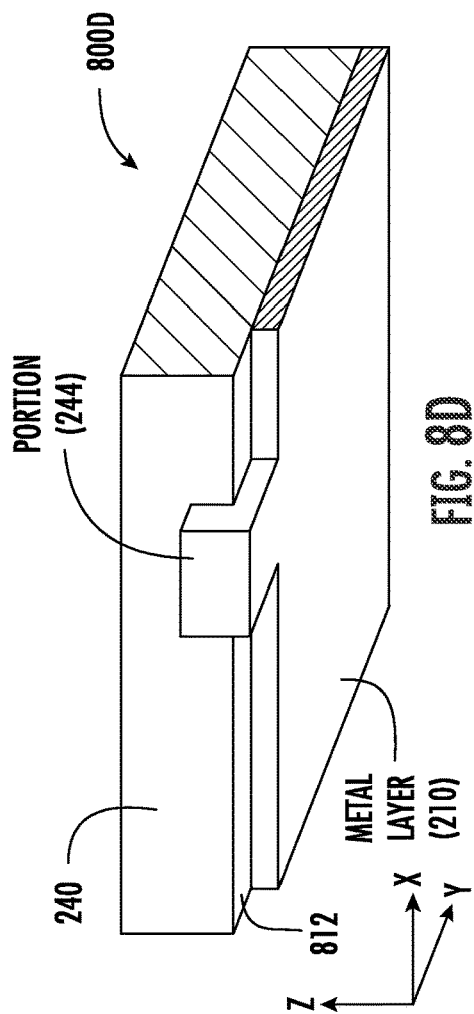

STACKED ACOUSTIC WAVE (AW) FILTER PACKAGES, INCLUDING CROSS-TALK REDUCTION LAYERS, AND RELATED FABRICATION METHODS

BACKGROUND

I. Field of the Disclosure

The technology of the disclosure relates generally to acoustic wave (AW) filter packages that include AW filters with AW filter circuits on substrates.

II. Background

A smartphone is an example of a mobile device that includes multiple transmitters and receivers for multiple wireless interfaces, including cellular telephone communication, Bluetooth, and Wi-Fi. A cellular telephone interface of such mobile devices may include multiple wireless interfaces that each include a transmitter and receiver. Each wireless interface is designed to transmit and receive radio-frequency (RF) analog signals within specific, non-overlapping frequency ranges (bands). Signals outside the frequency band(s) designated to a specific interface can interfere with communication, so transmitters and receivers may include filters to exclude signals outside the corresponding frequency range before transmission and after reception.

Acoustic wave (AW) filters are a type of filter that can be used for filtering out undesired frequencies in signals. AW filters use piezoelectric materials to convert analog electric signals to acoustic waves that are filtered in a solid propagation medium and then converted from the filtered acoustic waves back to analog signals. Mobile devices may contain multiple AW filters in an AW filter package because there may be multiple transmitters and receivers that each include an AW filter in the several wireless interfaces. Since AW filters can be formed on a semiconductor (e.g., silicon) substrate, existing semiconductor processing techniques can be used in the fabrication of AW filter packages.

Multiple AW filters can be formed on a single substrate to reduce the cost and space occupied by AW filter packages. To further reduce the cost and volume of an AW filter package, one substrate, including one or more AW filters, may be stacked (e.g., vertically) on another substrate, including one or more AW filters in a stacked AW filter package. However, there can be challenges with integrating multiple AW filters in a single AW filter package.

SUMMARY OF THE DISCLOSURE

Aspects disclosed in the detailed description include stacked acoustic wave (AW) filter packages, including cross-talk reduction layers. Related methods of fabricating such stacked AW filter packages are also disclosed. A stacked AW filter package includes a first substrate stacked on a second substrate. The first substrate has a first AW filter circuit on first surface and a metal layer on a second surface. The second substrate has a second AW filter circuit disposed in a cavity between the metal layer of the first substrate and a third surface of the second substrate. The metal layer is coupled to the second AW filter circuit by a metal interconnect formed in a metallization layer on a side surface of the first substrate. The metal layer provides isolation between the first AW filter circuit and the second AW filter circuit to reduce cross-talk (e.g., electromagnetic interference) within the stacked AW filter package between the first and second AW filter circuits. For example, cross-talk may otherwise occur or be significant between the first and second AW filter circuits in the stacked AW filter package, especially if the first and second AW filters circuits are coupled to the same signal source. Including the metal layer in the stacked AW filter package provides electromagnetic shielding that reduces the transmission of cross-talk between the first AW filter circuit and the second AW filter circuit. In this regard, inclusion of the metal layer improves signal quality of transmitted and received signals filtered in the first and second AW filter circuits.

The metal layer couples to a ground pad coupled to the second AW filter circuit in some exemplary aspects. In other exemplary aspects, a portion of the metal layer of the first substrate extends onto the side surface of the first substrate to couple to the metal interconnect in the metallization layer. In some examples, an insulation layer is disposed on the side surface of the first substrate, and a second metal interconnect coupled to the second AW filter circuit is disposed on the insulation layer and electrically insulated from the first substrate.

A stacked acoustic wave (AW) filter package is provided in one exemplary aspect. The stacked AW filter package comprises a first substrate comprising a first AW filter circuit on a first surface and a metal layer on a second surface of the first substrate. The stacked AW filter package also comprises a second substrate comprising a second AW filter circuit on a third surface, the second AW filter circuit disposed in a cavity between the metal layer on the first substrate and the third surface of the second substrate. The stacked AW filter package also comprises a metallization layer comprising at least one metal interconnect disposed on a side surface of the first substrate, the at least one metal interconnect coupled to the metal layer, and the second AW filter circuit.

In another exemplary aspect, a method of manufacturing a stacked AW filter package is disclosed. The method comprises forming a first AW filter circuit on a first surface of a first substrate and forming a metal layer on a second surface of the first substrate. The method further comprises forming a second AW filter circuit on a third surface of a second substrate and forming a cavity around the second AW filter circuit between the metal layer and the third surface of the second substrate. The method also comprises forming a metallization layer comprising at least one metal interconnect on a side surface of the first substrate, coupling the at least one metal interconnect coupled to the metallization layer, and the second AW filter circuit.

BRIEF DESCRIPTION OF THE FIGURES

FIGS. 7A-7D are a flowchart illustrating another exemplary fabrication process for fabricating the stacked AW filter package of FIGS. 2A-5;

FIGS. 8A-8D illustrate exemplary fabrication stages during fabrication of the stacked AW filter package of FIGS. 2A-5 according to the exemplary fabrication process in FIGS. 7A-7D;

DETAILED DESCRIPTION

Figure 1A:
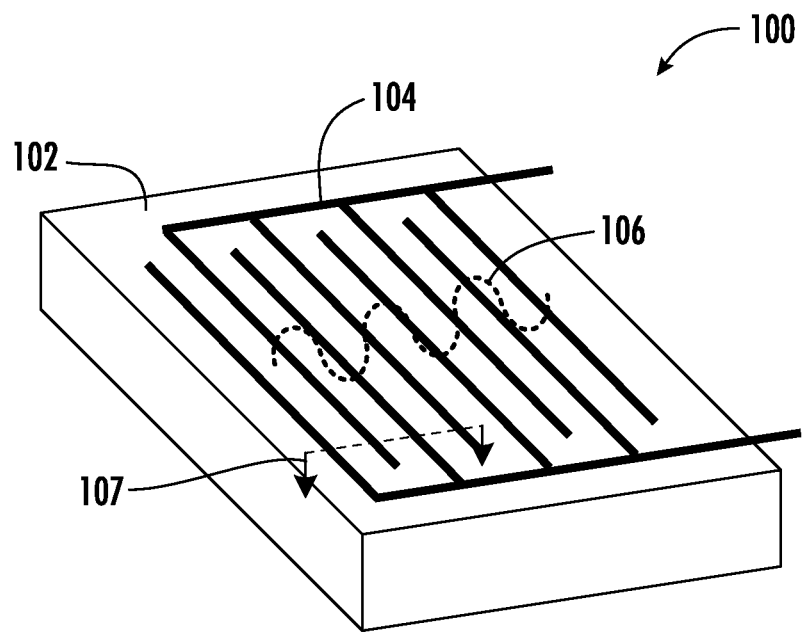
FIG. 1A is a diagram of a perspective view of an example of an electroacoustic device that may be used as an acoustic wave (AW) filter.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include stacked acoustic wave (AW) filter packages, including cross-talk reduction layers. Related methods of fabricating stacked AW filter packages are also disclosed. A stacked AW filter package includes a first substrate stacked on a second substrate. The first substrate has a first AW filter circuit on first surface and a metal layer on a second surface. The second substrate has a second AW filter circuit disposed in a cavity between the metal layer of the first substrate and a third surface of the second substrate. The metal layer is coupled to the second AW filter circuit by a metal interconnect formed in a metallization layer on a side surface of the first substrate. The metal layer provides isolation to reduce cross-talk (e.g., electromagnetic interference) within the stacked AW filter package between the first AW filter circuit and the second AW filter circuit. Including the metal layer in the stacked AW filter package improves signal quality of transmitted and received signals filtered in the first and second AW filter circuits. In some examples, the metal layer couples to a ground pad coupled to the second AW filter circuit. In other examples, a portion of the metal layer extends onto the side surface of the first substrate to couple to the metal interconnect in the metallization layer. While in other examples, an insulation layer is disposed on the side surface of the first substrate, and a second metal interconnect coupled to the second AW filter circuit is disposed on the insulation layer and electrically insulated from the first substrate.

Before discussing exemplary aspects of stacked AW filter packages that include a metal layer on a bottom surface of a first substrate to reduce cross-talk between a first AW filter circuit on the first substrate and a second AW filter circuit on a second substrate, as illustrated in FIGS. 2A-5 and 8A-8D, an example of a conventional surface AW (SAW) filter 100 is discussed with reference to FIGS. 1A and 1B.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein, and any of which may be incorporated into an AW filter. The electroacoustic device 100 includes an electrode structure 104, that may be referred to as an interdigital transducer (IDT), on the surface of a piezoelectric material 102. The electrode structure 104 generally includes first and second comb-shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

Figure 1B:
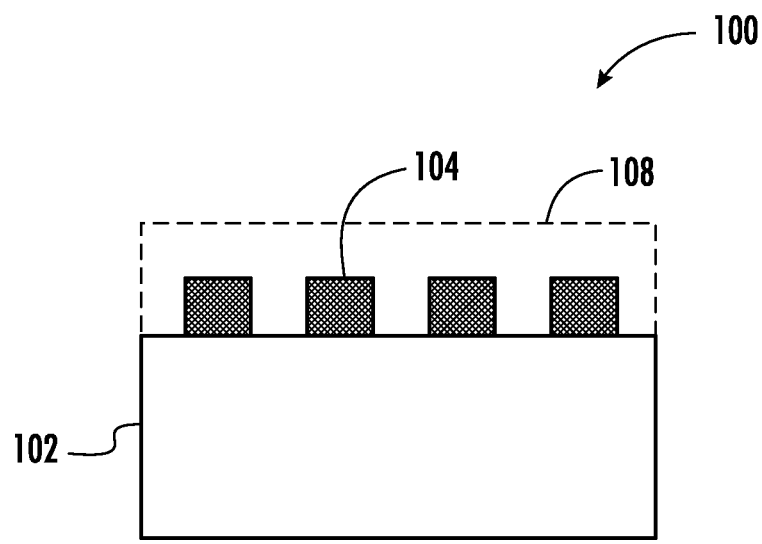
FIG. 1B is a diagram of a side view of the electroacoustic device of FIG. 1A.

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks, including layers of various materials, may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an undersurface of the cap layer. Electrical vias or bumps that allow the component to be electrically connected to connections on a substrate (e.g., via flip-chip or other techniques) may also be included.

Figure 2A:
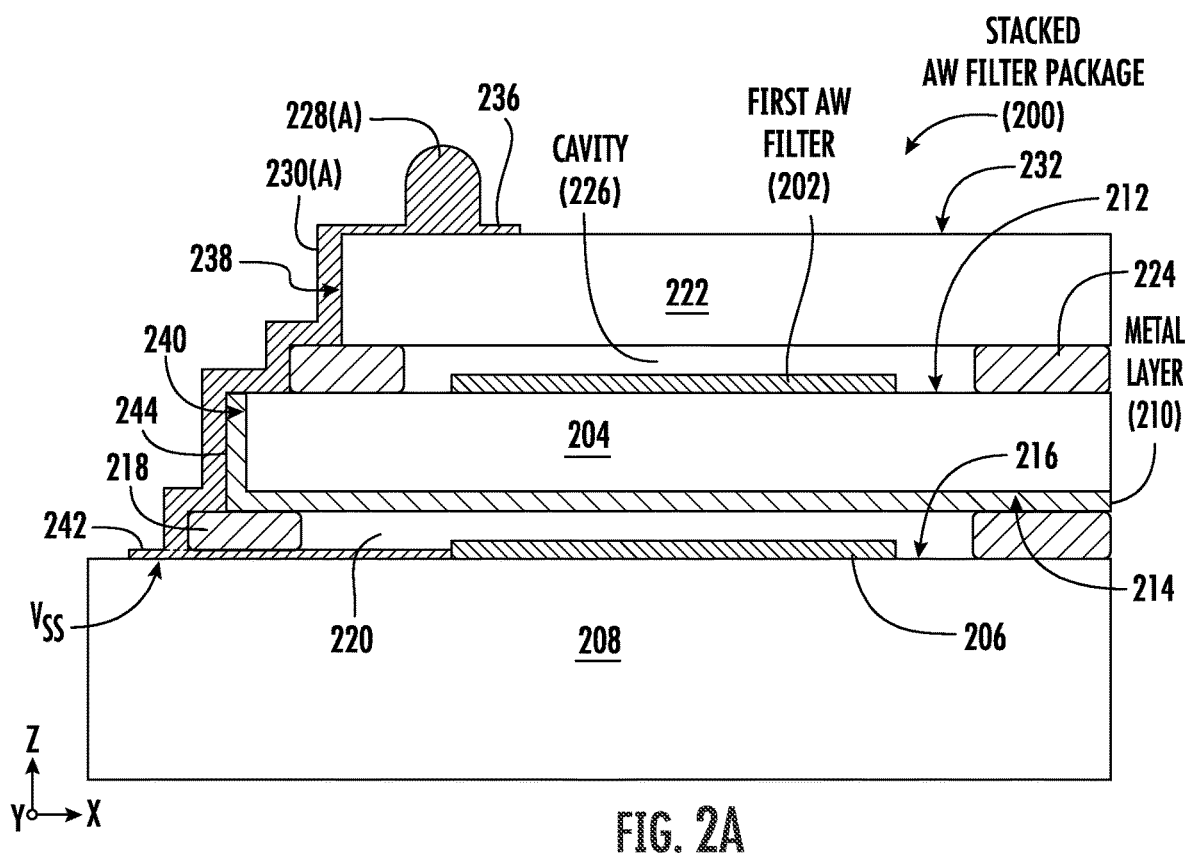
FIGS. 2A and 2B are illustrations of side views of cross-sections through a ground pin and a signal pin, respectively, of an exemplary stacked AW filter package that includes a metal layer to reduce cross-talk between a first AW filter circuit on a first substrate and a second AW filter circuit on a second substrate.
Figure 2B:
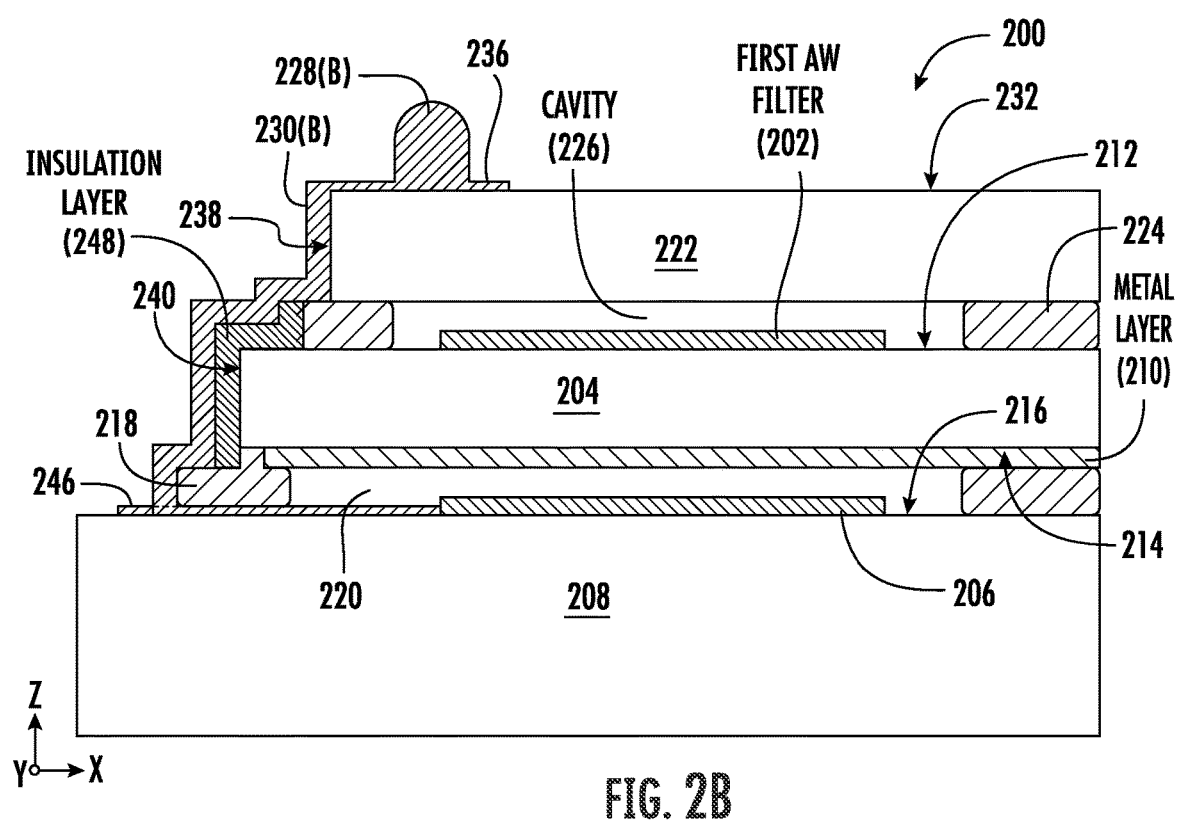

FIGS. 2A and 2B are illustrations of cross-sectional side views of an exemplary stacked AW filter package 200 that includes stacked first AW filter circuit 202 on a first substrate 204 and second AW filter circuit 206 on a second substrate 208 to provide multiple AW filters. Each of the first substrate 204 and the second substrate 208 may include one or more electroacoustic devices similar to the electroacoustic device 100 in FIG. 1 as part of an AW filter circuit in an AW filter. As discussed in more detail below, the stacked AW filter package 200 includes a metal layer 210 to reduce cross-talk between the first AW filter circuit 202 on the first substrate 204 and the second AW filter circuit 206 on the second substrate 208. FIG. 2A is a side view of a cross-section of the stacked AW filter package 200 through a ground pad 242. FIG. 2B is a side view of a cross-section of the stacked AW filter package 200 through a signal pad 246. The stacked AW filter package 200 will now be described in reference to the cross-sectional side views in FIGS. 2A and 2B.

In this regard, as shown in FIGS. 2A and 2B, the AW filter package 200 includes a first AW filter circuit 202 on a first substrate 204 and a second AW filter circuit 206 on a second substrate 208 stacked above the first AW filter circuit 202 in the vertical direction (Z-axis direction). The first AW filter circuit 202 and second AW filter circuit 206 are referred to herein collectively as "first and second AW filter circuits 202, 206"). The first AW filter circuit 202 and the second AW filter circuit 206 can each correspond to the SAW filter circuit 102 in FIG. 1 but may also be any other type or configuration of an AW filter circuit. Therefore, details of the first AW filter circuit 202 and the second AW filter circuit 206 are not shown in FIG. 2A or 2B. The first and second AW filter circuits 202, 206 include first metal interconnects for receiving input RF signals from an external circuit (e.g., antenna) and providing filtered RF signals as an output to an external circuit.

In the AW filter package 200 in FIGS. 2A and 2B, the first AW filter circuit 202 is disposed on a first surface 212 of the first substrate 204. For example, the first substrate 204 may be formed of a semiconductor material (e.g., silicon) formed in wafers to take advantage of advances and the low cost of semiconductor processing techniques. The metal layer 210 is disposed on a second surface 214 of the first substrate 204 to reduce cross-talk between the first AW filter circuit 202 and the second AW filter circuit 206. The second surface 214 is opposite to the first surface 212. With the orientation of the AW filter package 200 shown in FIG. 2, the first surface 212 can also be referred to as a top surface 212, and the second surface 214 can also be referred to as a bottom surface 214 of the first substrate 204 because the top surface 212 is disposed above the bottom surface 214 in the vertical direction (Z-axis direction).

With continuing reference to FIGS. 2A and 2B, the second AW filter circuit 206 is disposed in or on a third surface 216 of the second substrate 208. The first substrate 204 is stacked on the second substrate 208 in the AW filter package 200 to minimize the area occupied by AW filter circuits on the first and second substrates 204, 208. The second substrate 208 may also be formed of a semiconductor material (e.g., silicon) formed in wafers, for example, to take advantage of advances and the low cost of semiconductor processing techniques. In this regard, the first substrate 204 may be stacked on (e.g., above in the vertical, Z-axis direction) the second substrate 208, or the second substrate 208 may be stacked on (e.g., below in the vertical, Z-axis direction) the first substrate 204. A frame 218 is disposed between the metal layer 210 on the second surface 214 of the first substrate 204 and the surface 216 of the second substrate 208. The second AW filter circuit 206 is disposed in a cavity 220 between the metal layer 210 and the surface 216 of the second substrate 208. The cavity 220 may also include air or gas. The cavity 220 prevents external interference with the propagation of acoustic waves of the second AW filter circuit 206.

The AW filter package 200 in FIGS. 2A and 2B also includes a cap substrate 222 disposed on the first surface 212 of the first substrate 204. The cap substrate 222 is separated from the first surface 212 by a frame 224 to form a cavity 226 in which the first AW filter circuit 202 is disposed. The cap substrate 222 provides a cap to the cavity 226 in the manner that the first substrate 204 provides a cap to the cavity 220. The cavity 226 also includes air or another gas around the first AW filter circuit 202. The cap substrate 222 may be glass, for example, or another non-conductive substrate material. The stacked AW filter package 200 also includes contacts 228A, 228B, which are disposed on metal interconnects 230A, 230B on a contact surface 232 of the cap substrate 222 for connecting the second AW filter circuit 206 to external circuits. The contacts 228A, 228B are coupled to the second AW filter circuit 206 by the metal interconnects 230A, 230B formed in a metallization (redistribution) layer 236. The metallization layer 236 extends from the contact surface 232 onto a side surface 238 of the cap substrate 204 and onto a side surface 240 of the first substrate 204. The side surface 240 extends between the first surface 212 and the second surface 214 of the first substrate 204. Additional contacts (not shown) may be disposed on the contact surface 232 for connecting the first AW filter circuit 202 to external circuits.

In the stacked AW filter package 200 in FIGS. 2A and 2B, the first AW filter circuit 202 filters a first RF signal while the second AW filter circuit 206 filters another RF signal. In some examples, the first and second AW filter circuits 202, 206 are not electrically associated with each other in operation, but in other examples, the first and second AW filter circuits 202, 206 may both be coupled to a same antenna, not shown, coupled to the AW filter package 200. Thus, the first and second AW filter circuits 202, 206 may provide different filters for a same RF signal or may filter different RF signals. Time-varying voltages occurring in each of the first and second AW filter circuits 202, 206 can create cross-talk or noise from electromagnetic interference (EMI), causing unwanted variations on a signal in a nearby circuit.

The magnitude of EMI is attenuated with distance, but the first and second AW filter circuits 202, 206 are in such close proximity to each other in the AW filter package 200 that the noise generated in the first AW filter circuit 202 can interfere with operation of the second AW filter circuit 206 and the noise generated in the second AW filter circuit 206 can interfere with signals of the first AW filter circuit 202. Cross-talk may be especially problematic when the first AW filter circuit 202 and the second AW filter circuit 206 are coupled to the same antenna.

The metal layer 210 is included because the metal layer 210 blocks or at least reduces transmission of some of the cross-talk between the first and second AW filter circuits 202, 206 to reduce noise and improve signal quality. In this example, as discussed in more detail below, a metal layer 210 is disposed between the first AW filter circuit 202 and the second AW filter circuit 206 to reduce cross-talk between the first AW filter circuit 202 and the second AW filter circuit 206. The shielding provided by the metal layer 210 may be beneficial between any two AW filter circuits in the stacked AW filter package 200 and may be particularly beneficial in devices in which the first AW filter circuit 202 and the second AW filter circuit 206 are coupled to a same antenna (not shown). Cross-talk refers to EMI or noise that one circuit inadvertently induces on another circuit when circuits are in sufficiently close proximity that the magnitude of the cross-talk has not attenuated and induces an unwanted signal on the affected circuit. The metal layer 210 operates as an electromagnetic shield (i.e., a Faraday shield) to block propagation of the cross-talk between adjacent circuits.

FIG. 2A is a view of a cross-section through the ground pad 242, which may also be known as a "landing pad" for the metal interconnect 230A. As shown in FIG. 2A, the metal interconnect 230A couples the contact 228A to the ground pad 242, which further couples to a ground circuit path (not shown) of the second AW filter circuit 206. The contact 228A may be coupled to a source of a ground voltage $V_{SS}$ (e.g., 0 volts). A portion 244 of the metal layer 210 extends from the second surface 214 through the frame 218 and to the side surface 240 of the first substrate 204. The metal interconnect 230A formed on the side surface 240 is provided to couple the portion 244 of the metal layer 210 to the ground pad 242 of the second AW filter circuit 206 on the surface 216 of the second substrate 208. There may be multiple portions 244 coupled to ground pads 242 to couple the metal layer 210 to the second AW filter circuit 206 in several locations on the surface 216.

The metal layer 210 is provided on the second surface 214 between the first AW filter circuit 202 and the second AW filter circuit 206 to reduce cross-talk between the first AW filter circuit 202 and the second AW filter circuit 206. The metal layer 210 may include layers of more than one metal for a total thickness of 2.5 microns, for example, but could be thicker or thinner. For example, the metal layer 210 may include a layer of titanium (Ti) on the second surface 214 of the first substrate 204 and a layer of copper (Cu) formed on the layer of Ti. Coupling the metal layer 210 to the ground pad 242 in the second AW filter circuit 206 provides a shield (e.g., Faraday shield) to isolate the first AW filter circuit 202 from the second AW filter circuit 206 to reduce cross-talk (e.g., electromagnetic interference) between the first and second AW filter circuits 202, 206. In this regard, the metal layer 210 can improve the signal quality of signals transmitted from and received in a wireless device employing the AW filter package 200.

FIG. 2B is a view of a cross-section through the signal pad 246, which is provided to show an insulation layer 248 to insulate metal interconnect 230B from the first substrate 204. In FIG. 2B, the metal interconnect 230B couples the contact 228B to the signal pad 246, which carries a signal of the second AW filter circuit 206 on the second substrate 208. The signal pad 246 may carry any signal of the second AW filter circuit 206. The metal layer 210 does not extend through the frame 218 onto the side surface 240 to couple to the metal interconnect 230B. The metal interconnect 230B is disposed on the insulation layer 248, which is disposed on the side surface 240 of the first substrate 204. The insulation layer 248 is between the metal interconnect 230B and the side surface 240 of the first substrate 204. The insulation layer 248 insulates the metal interconnect 230B from the first substrate 204, which may be formed of a semiconductor material. Coupling the metal interconnect 230B to the first substrate 204 could create paths for leakage current between the first AW filter circuit 202 and the metal interconnect 230B, which can cause power loss and interfere with operation. In some examples, the insulation layer 248 is also disposed on the side surface 238 of the cap substrate 222, the frame 224, and on the first surface 212, and the metal interconnect 234B is disposed on the insulation layer 248.

Although not shown in any of FIG. 2A, 2B, or 3-5, the metal layer 210 may be a continuous metal layer but may be patterned in any manner (e.g., with voids or slits) to provide shielding in areas of the second surface 214, as needed. In this regard, the metal layer 210 may be disposed on first portions of the second surface 214, such as between AW filter circuits on the first and second substrates 204, 208, and not disposed in second portions of the second surface 214, in which AW filter circuits are not located.

Figure 3:
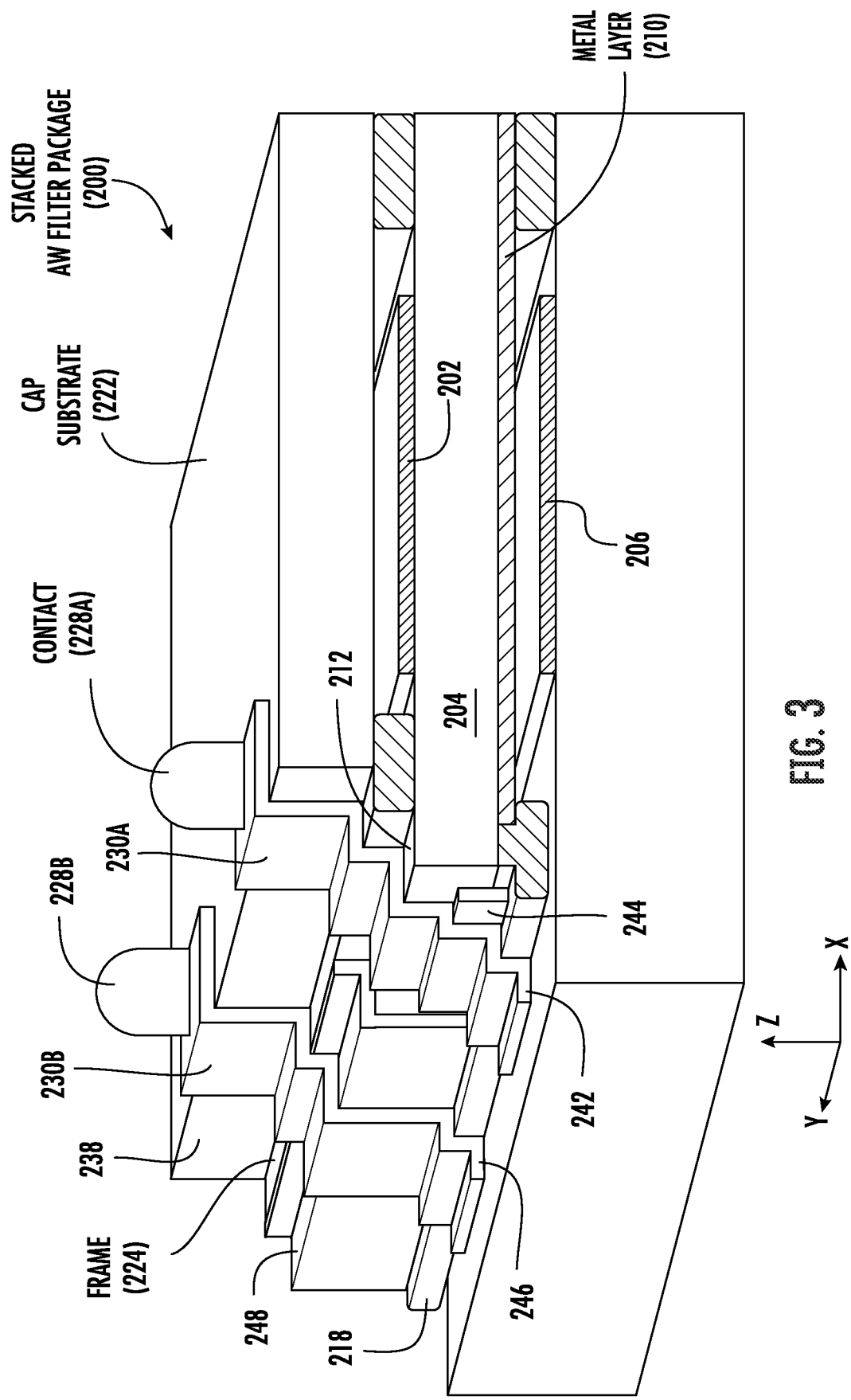
FIG. 3 is a perspective view of the stacked AW filter package, an exemplary stage of fabrication illustrating one metal interconnect on the side surface of the first substrate coupled to the metal layer and another metal interconnect insulated from the metal layer.

FIG. 3 is a perspective view of the AW filter package 200 shown in FIGS. 2A and 2B. FIG. 3 is provided to more clearly illustrate certain aspects of the AW filter package 200, in particular, the metal interconnects 230A, 230B on the side surface 240 of the first substrate 204. As shown in this non-limiting example, the metal interconnect 230A extends from the contact 228A and is disposed on the side surface 238 of the cap substrate 222, onto the frame 224, onto the first surface 212 of the first substrate 204, onto the portion 244 of the metal layer 210, and then onto the frame 218 and the ground pad 242. The metal interconnect 230A couples the metal layer 210 and the second AW filter circuit 206 to the contact 228A. For example, the contact 228A may receive a supply of the ground voltage $V_{SS}$ from an external circuit in a mobile device. The metal interconnect 230B extends from the contact 228B and is disposed on the side surface 238 of the cap substrate 222, the insulation layer 248, the frame 218, and the signal pad 246. The metal interconnect 230B couples the signal pad 246 of the AW filter circuit 206 to the contact 228B, which may be coupled to at least one of the first AW filter circuit 202 and an external circuit.

Figure 4:
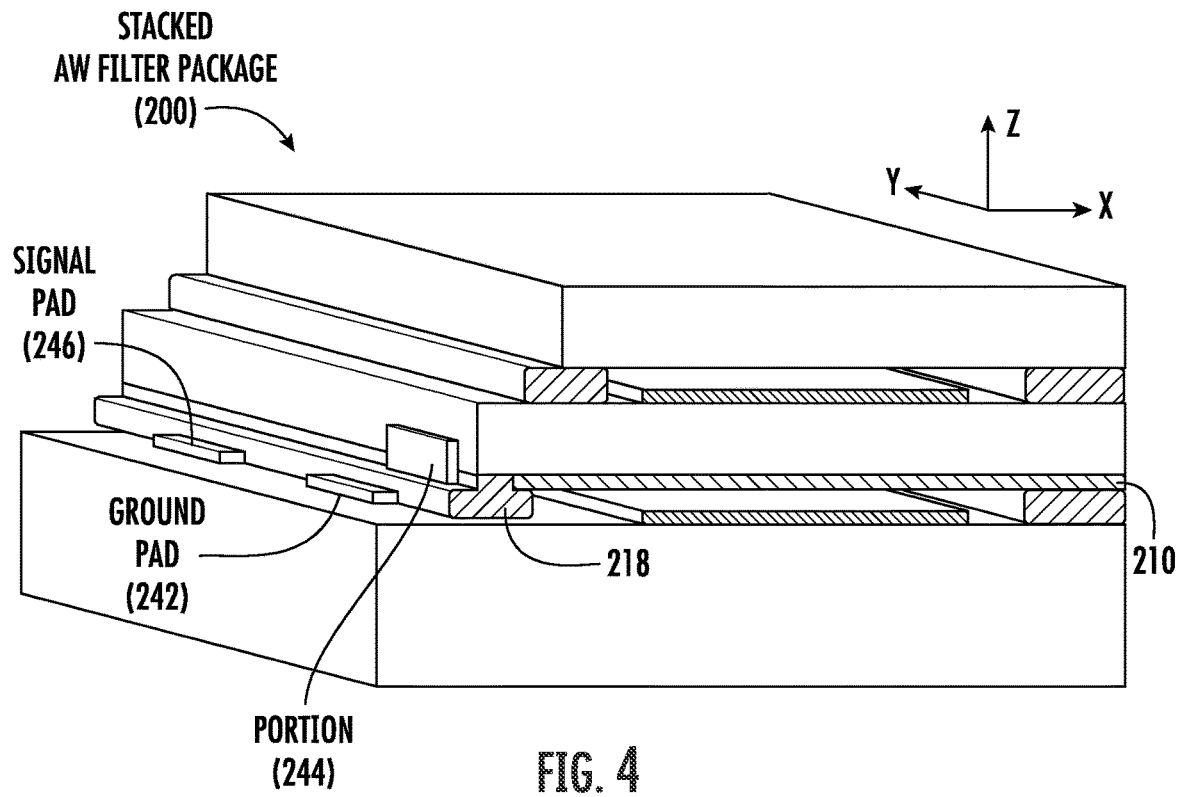
FIG. 4 is a perspective view of the stacked AW filter package of FIG. 3 in an exemplary stage of fabrication that illustrates a side view and cross-sectional side view of the metal layer on the second side of the first substrate and on the side surface of the substrate.

FIG. 4 is a perspective view of the AW filter package 200 in FIGS. 2A, 2B, and 3 in an exemplary stage of fabrication prior to the formation of certain features to more clearly illustrate other features of the AW filter package 200 that may not be apparent in previous figures. The AW filter package 200 in FIG. 4 does not include the metal interconnects 230A, 230B of the metallization layer 236, the contacts 228A, 228B on the contact surface 232, or the insulation layer 248.

FIG. 4 shows the side surface 240 of the first substrate 204 with the portion 244 of the metal layer 210 extending through the frame 218 and onto the side surface 240. Thus, on either side of the portion 244, the metal layer 210 does not extend through the frame 218 to keep the metal layer 210 separated from other metal interconnects (e.g., 230B). To provide an effective shield, the metal layer 210 should be properly grounded to either the first AW filter circuit 202 or the second AW filter circuit 206. Coupling the metal layer 210 to signals of the second AW filter circuit 206 could cause voltage fluctuations in the metal layer 210, which may contribute to, rather than alleviate, the cross-talk to the first AW filter circuit 202. FIG. 4 shows the ground pad 242 and the signal pad 246, which may be metal traces extending through the frame 218 on the surface 216 of the second substrate 208. The ground pad 242 and the signal pad 246 are just examples of pads coupled to the second AW filter circuit 206 and coupled to contacts such as contacts 228A, 228B on the contact surface 232 of the cap substrate 222 for connection to an external circuit or to the first AW filter circuit 202.

Figure 5:
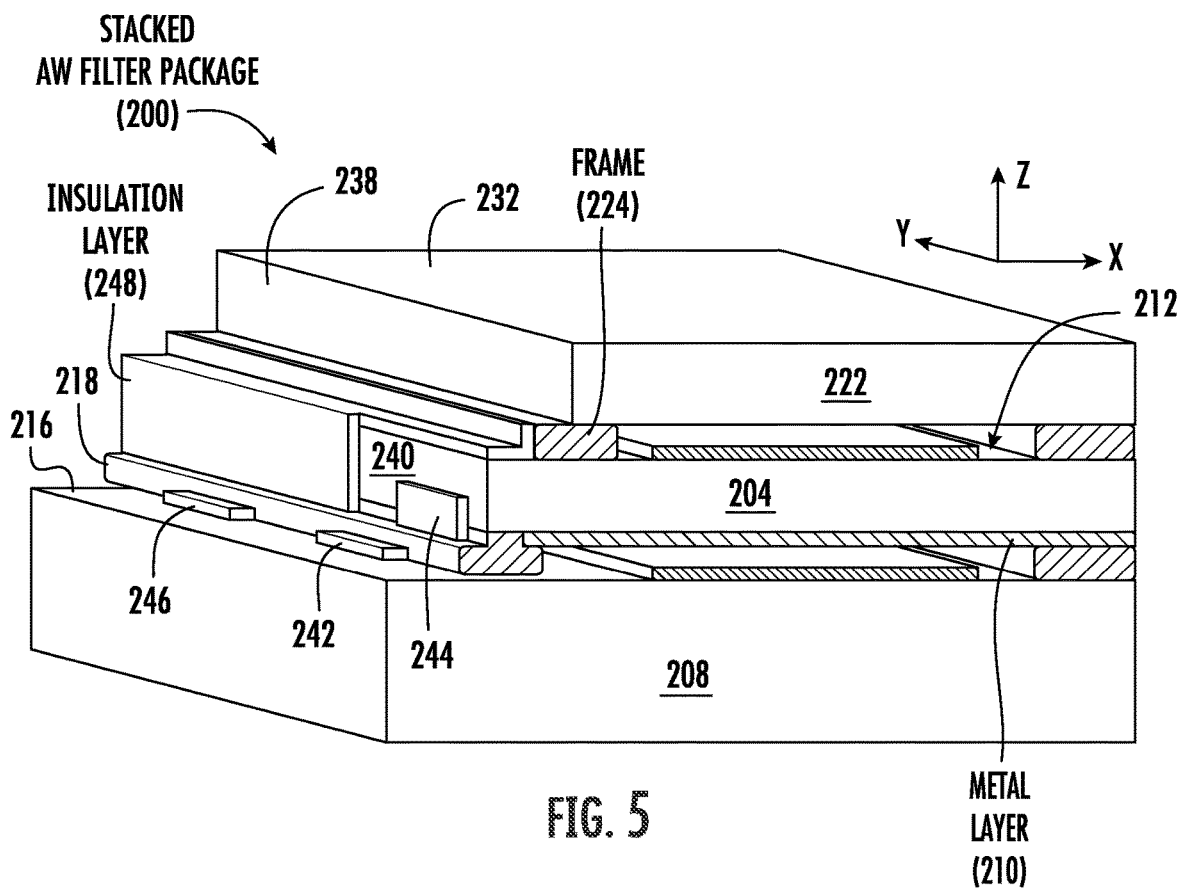
FIG. 5 is a perspective view of the stacked AW filter package of FIG. 4 in another exemplary stage of fabrication illustrating an insulation layer disposed on the side surface of the first substrate and patterned to expose a portion of the metal layer extending onto the side surface.

FIG. 5 is a perspective view of the AW filter package 200 as shown in FIG. 4 in another exemplary stage of fabrication after the insulation layer 248 is disposed on the side surface 240 of the first substrate 204. The insulation layer 248 is formed on the first surface 212 and the side surface 240 of the first substrate 204, as previously noted, to insulate the first substrate 204 from the metal interconnect 230B (see FIG. 3) because the first substrate 204 may be a semiconductor. Coupling the metal interconnect 230B to the side surface 240 of the first substrate 204 could allow leakage current to flow between the first AW filter circuit 202 on the first substrate 204 and the metal interconnect 230B coupled to the second AW filter circuit 206. The insulation layer 248 is patterned to expose the portion 244 of the metal layer 210 extending onto the side surface 240 of the first substrate 204, so the metal interconnect 230A can couple to the portion 244. The insulation layer 248 may be formed (e.g., deposited) and then patterned or etched. Though not shown in FIG. 5 for better visibility of the ground pad 242 and the signal pad 246, the insulation layer 248 may extend over the frame 218 and onto the surface 216 of the second substrate 208 to insulate the second substrate 208 from the metal interconnect 230B. The insulation layer 248 may also extend across the frame 224, onto the side surface 238 of the cap substrate 222, and onto the contact surface 232.

Figure 6:
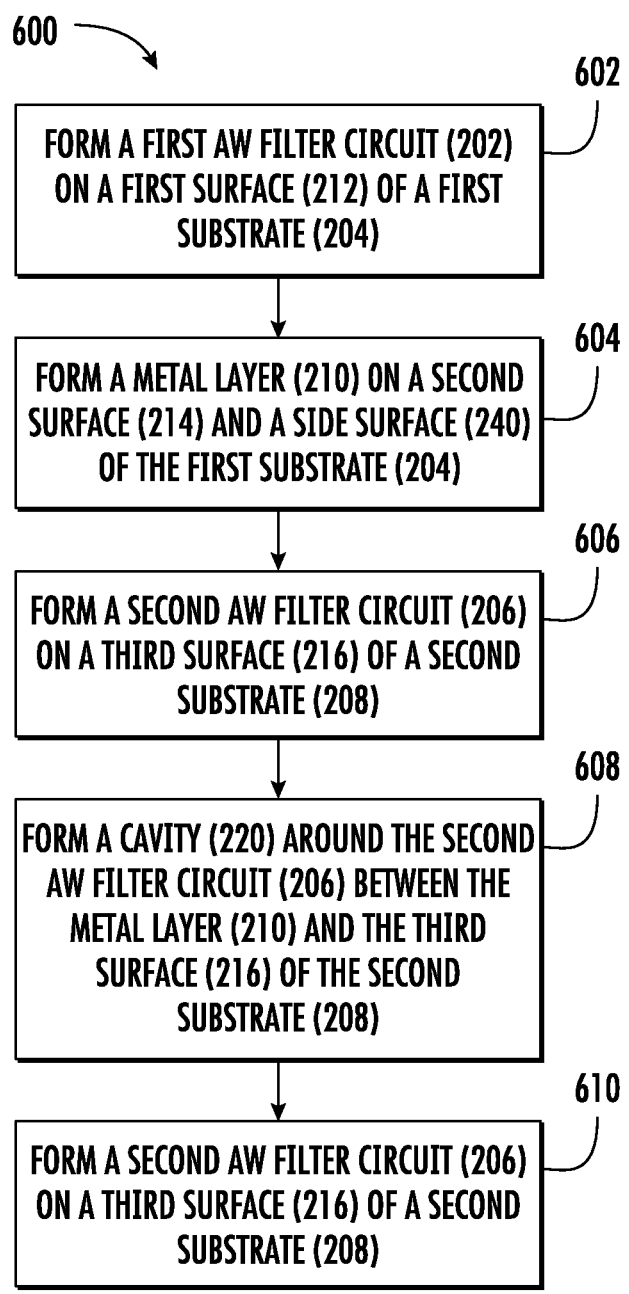
FIG. 6 is a flowchart illustrating an exemplary process for fabricating a stacked AW filter package that includes a metal layer to reduce cross-talk between a first AW filter circuit on a first substrate and a second AW filter circuit on a second substrate, including stacked AW filter package in FIGS. 2A-5.
Figure 8A:
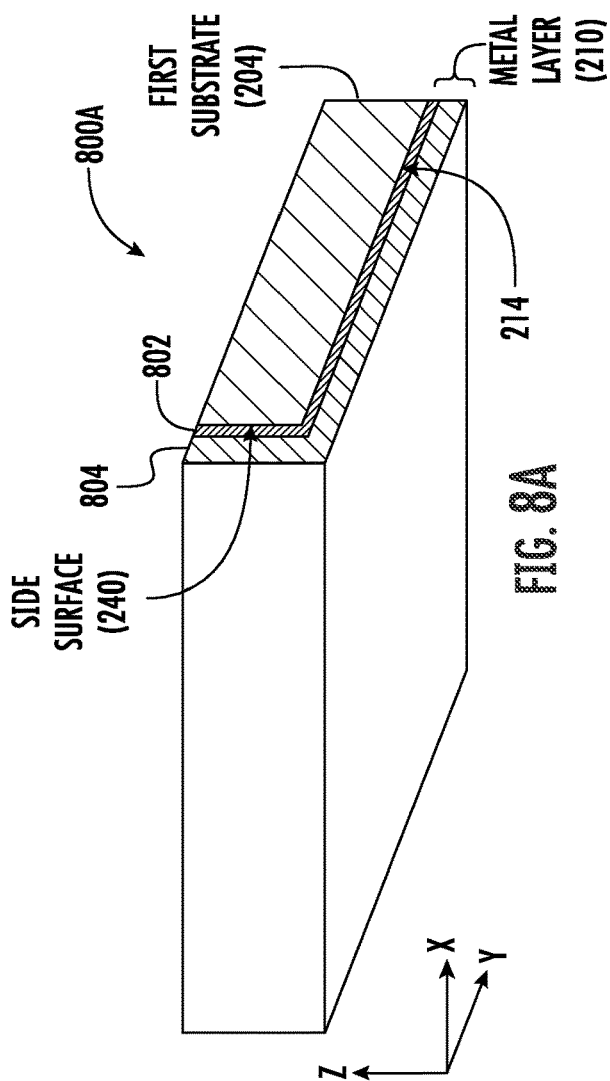

An exemplary fabrication process 600 for fabricating the AW filter package 200 shown in FIGS. 2A-5 is illustrated in FIG. 6. The process 600 includes forming a first AW filter circuit 202 on a first surface 212 of a first substrate 204 (block 602). The fabrication process 600 includes forming a metal layer 210 on a second surface 214 and a side surface 240 of the first substrate 204 (block 604). The process 600 also includes forming a second AW filter circuit 206 on a third surface 216 of a second substrate 208 (block 606). The process 600 further includes forming a cavity 220 around the second AW filter circuit 206 between the metal layer 210 and the third surface 216 of the second substrate 208 (block 608). The process 600 further includes forming a second AW filter circuit (206) on a third surface (216) of a second substrate (208) (block 610).

Figure 7A:
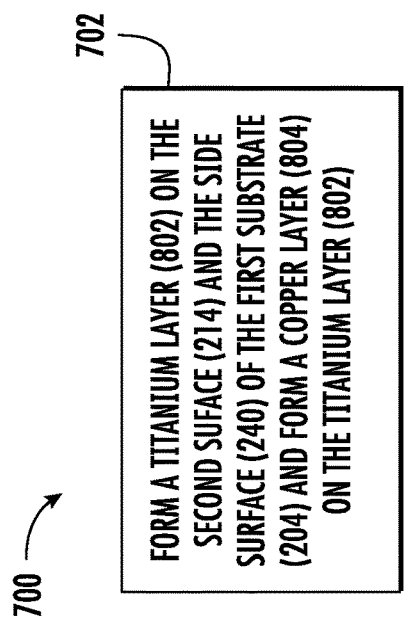

An exemplary fabrication process 700 for forming the metal layer 210 is described with reference to FIGS. 7A-7D. Fabrication stages of the process 700 are illustrated as fabrication stages 800A-800D in FIGS. 8A-8D. In FIG. 7A, the process 700 includes, as illustrated in the fabrication stage 800A in FIG. 8A, forming a titanium layer 802 on the second surface 214 and the side surface 240 of the first substrate 204 and forming a copper layer 804 on the titanium layer 802 (block 702). As described herein, the metal layer 210 is not limited to a titanium layer 802 and a copper layer 804. In this regard, the metal layer 210 may include fewer or more layers than the titanium layer 802 and the copper layer 804 and may include one or more other metals. The metal layer 210 may be formed by sputtering one or more metals onto the second surface 214 and the side surface 240 of the first substrate 204. Forming the metal layer 210 is not limited to sputtering. In FIG. 7B, forming the metal layer 210 further includes, as illustrated in fabrication stage 800B in FIG. 8B, forming a resist layer 806 on the metal layer 210 (block 704). For example, the resist layer 806 may be a photo-resistive polymer material 808.

Figures 7C, 8C:
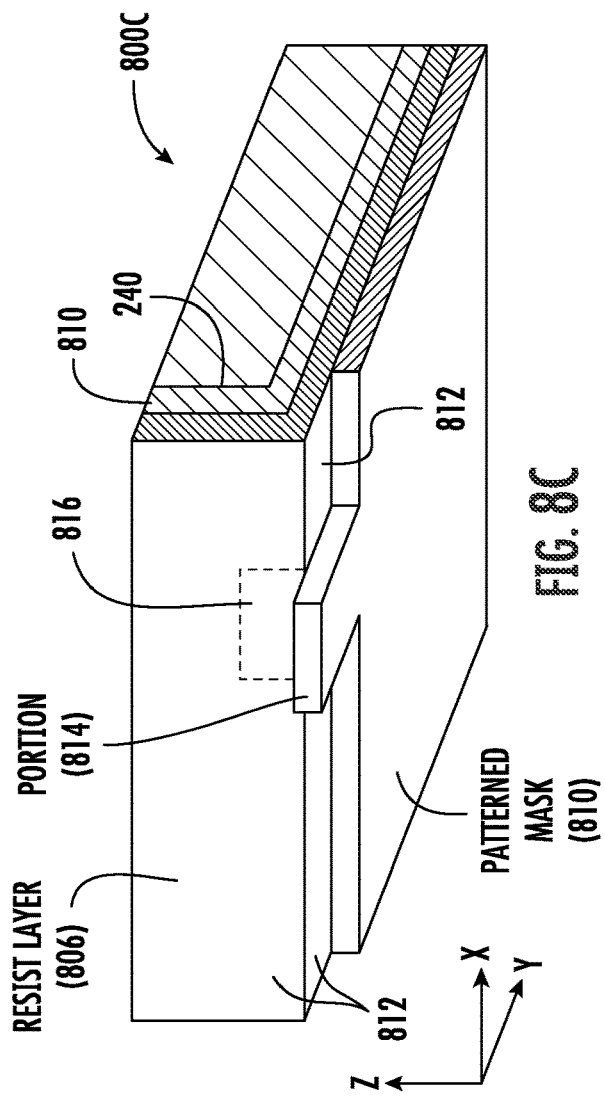

In FIG. 7C, forming the metal layer 210 further includes, as illustrated in the fabrication stage 800C in FIG. 8C, disposing a patterned mask 810 on the resist layer 806 and developing the resist layer 806 in exposed areas 812 not covered by the patterned mask 810 (block 706). FIG. 8C shows the patterned mask 810 disposed on the metal layer 210 extending beyond the side surface 240 of the first substrate 204. In FIG. 7D, forming the metal layer 210 further includes, in fabrication stage 800D in FIG. 8D, which includes removing the resist layer 806 in the exposed areas 812 and etching the metal layer 210 from the exposed areas 812 (block 708). Forming the metal layer 210 may include additional fabrication stages (not shown), such as developing the patterned mask and removing the resist material in the areas 812 exposed by the patterned mask 810.

Figure 9:
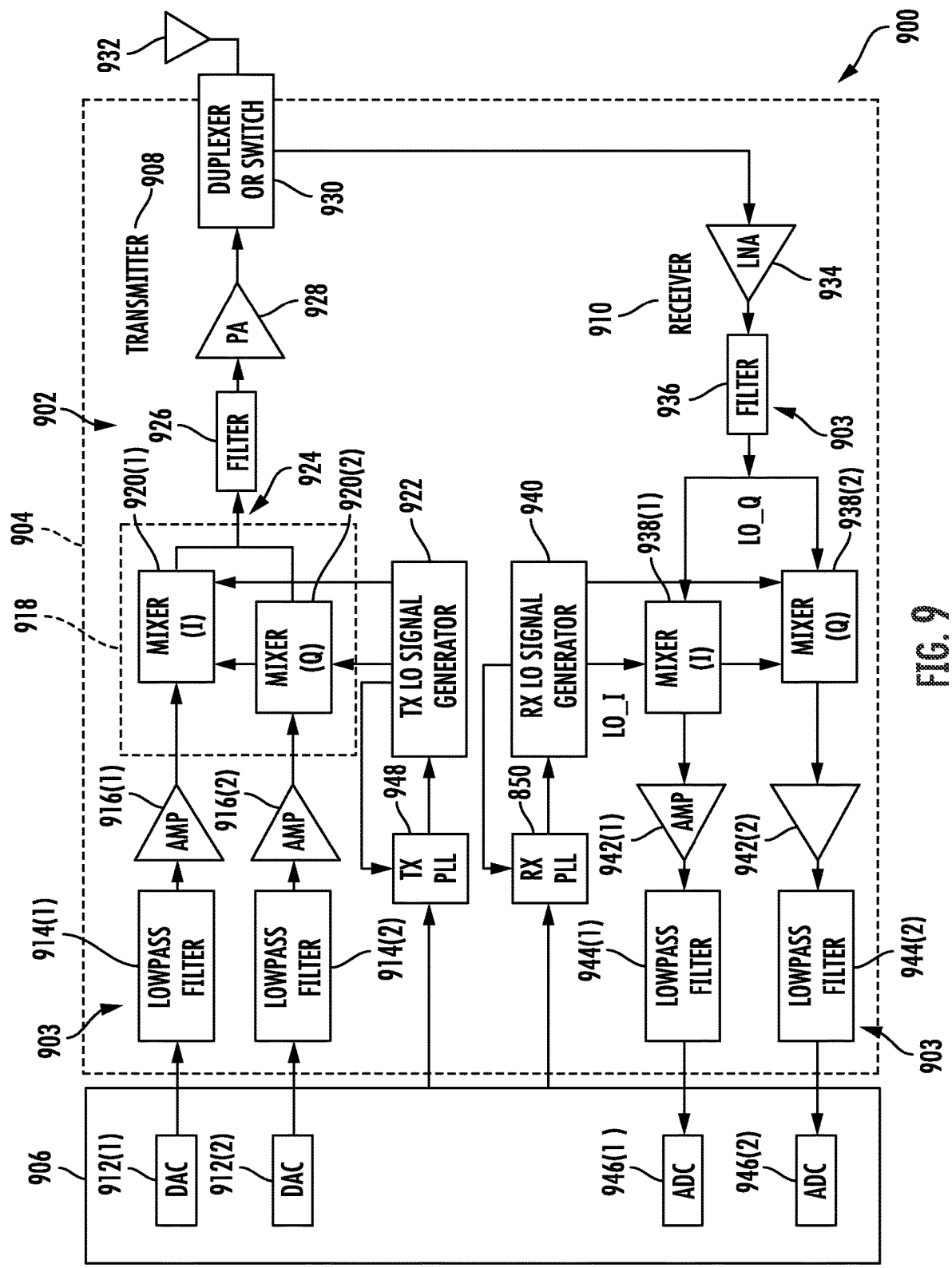
FIG. 9 is a block diagram of an exemplary wireless communications device that includes a radio-frequency integrated circuit (RFIC), including a stacked AW filter package including a first AW filter on a first surface of a first substrate, a metal layer on a second surface of the first substrate, and a second AW filter between the metal layer and a second substrate, the metal layer reducing cross-talk between the first and second AW filter circuits, including the stacked AW filter package in FIGS. 2A-5, and 8A-8D.

FIG. 9 illustrates an exemplary wireless communications device 900 that includes RF components formed from one or more ICs 902 and can include stacked AW filter packages 903. The stacked AW filter packages 903 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-5 and 8A-8D, and according to any of the aspects disclosed herein. The wireless communications device 900 may include or be provided in any of the above-referenced devices as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RFICs, mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. The lowpass filters 914(1), 914(2) may be implemented as AW filter packages 903. Amplifiers (AMPs) 916(*l*), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932. Any of the lowpass filters 914(1) and 914(2), or the filter 926, may be an acoustic wave filter (AW filter) packages 903.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. Any of the filter 936 and the lowpass filters 944(1), 944(2) may be AW filter packages 903. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Wireless communications devices 900 that can each include stacked AW filter packages 903. The stacked AW filter packages 903 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-5 and 8A-8D, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
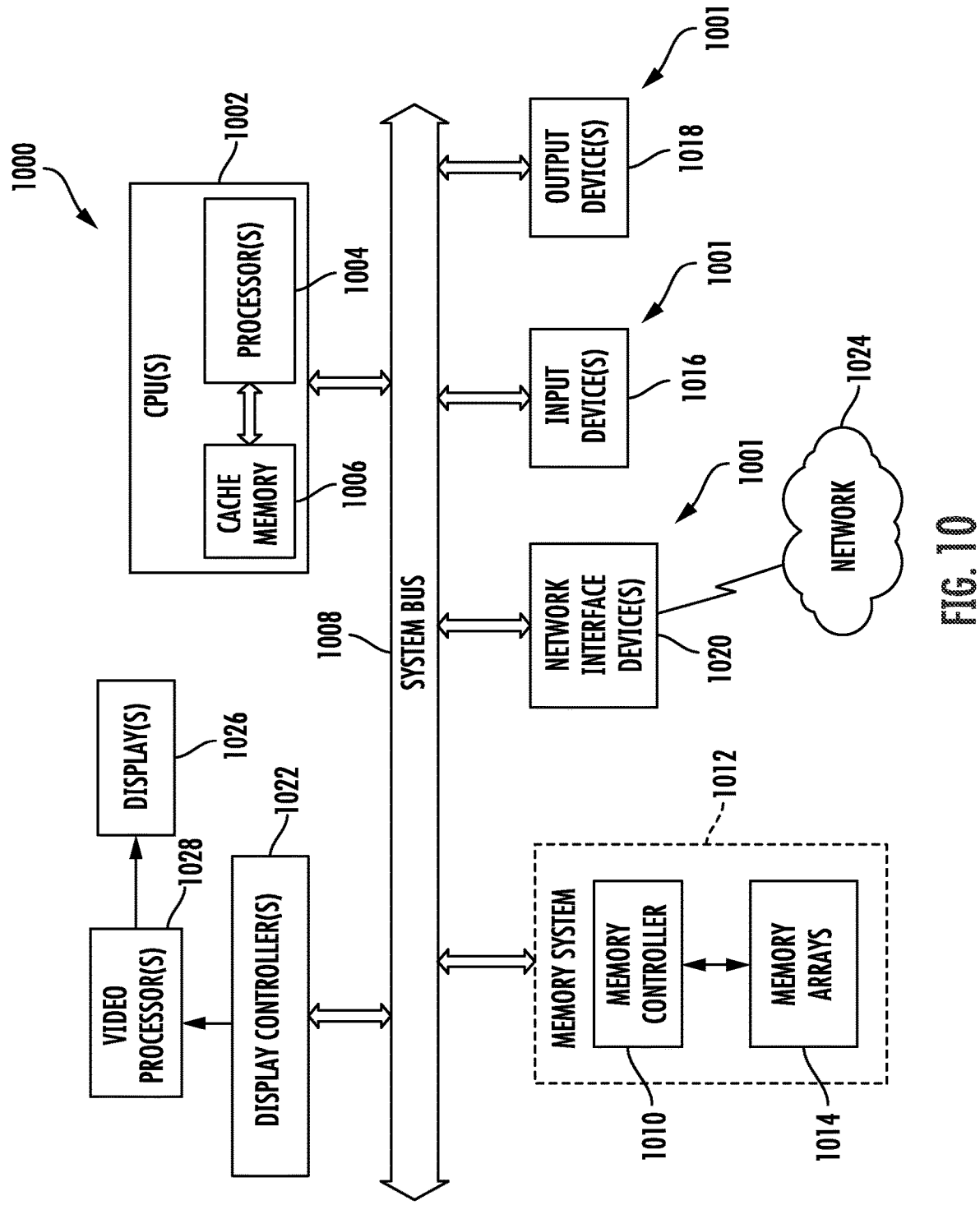
FIG. 10 is a block diagram of an exemplary processor-based system that can include an RFIC including a stacked AW filter package including a first AW filter on a first surface of a first substrate, a metal layer on a second surface of the first substrate, and a second AW filter between the metal layer and a second substrate, the metal layer reducing cross-talk between the first and second AW filter circuits, including the stacked AW filter package in FIGS. 2A-5, and 8A-8D.

FIG. 10 illustrates an example of a processor-based system 1000, including RF circuits including stacked AW filter packages 1001. The stacked AW filter packages 1001 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-5 and 8A-8D, and according to any aspects disclosed herein. In this example, the processor-based system 1000 includes one or more central processor units (CPUs) 1002, which may also be referred to as CPU or processor cores, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided; wherein each system bus 1008 constitutes a different fabric.

Other master and slave devices can be connected to the system bus 1008. As illustrated in FIG. 10, these devices can include a memory system 1012 that includes the memory controller 1010 and one or more memory arrays 1014, one or more input devices 1016, one or more output devices 1018, one or more network interface devices 1020, and one or more display controllers 1022, as examples. Any of the one or more input devices 1016, one or more output devices 1018, and one or more network interface devices 1020 may transmit and/or receive analog signals and include the stacked AW filter package 1001 to filter such signals. Each of the memory systems 1012, the one or more input devices 1016, the one or more output devices 1018, the one or more network interface devices 1020, and the one or more display controllers 1022 can include RF circuits, including stacked AW filter packages 1001. The stacked AW filter packages 1001 include stacked AW filter packages 803. The stacked AW filter packages 803 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-5 and 8A-8D, and according to any of the aspects disclosed herein. The input device(s) 1016 can include any type of input device, including, but not limited to, input keys, switches, voice processors, etc. The output device(s) 1018 can include any type of output device, including, but not limited to, audio, video, other visual indicators, etc. The network interface device(s) 1020 can be any device configured to allow an exchange of data to and from a network 1024. The network 1024 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1020 can be configured to support any type of communications protocol desired.

The CPU(s) 1002 may also be configured to access the display controller(s) 1022 over the system bus 1008 to control information sent to one or more displays 1026. The display controller(s) 1022 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light-emitting diode (LED) display, etc. The display controller(s) 1022, display(s) 1026, and/or the video processor(s) 1028 can include RF circuits including stacked AW filter packages 1001. The stacked AW filter packages 1001 include stacked AW filter packages 803. The stacked AW filter packages 803 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-5 and 8A-8D, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A stacked acoustic wave (AW) filter circuit, comprising:
    a first substrate comprising a first AW filter circuit on a first surface;
    a metal layer on a second surface of the first substrate;
    a second substrate comprising a second AW filter circuit on a third surface, the second AW filter circuit disposed in a cavity between the metal layer on the first substrate and the third surface of the second substrate; and
    a metallization layer comprising at least one metal interconnect disposed on a side surface of the first substrate, the at least one metal interconnect coupled to the metal layer, and the second AW filter circuit.

2. The stacked AW filter package of clause 1, wherein the at least one metal interconnect is coupled to a ground pad coupled to the second AW filter circuit.

3. The stacked AW filter package of clause 1 or clause 2, further comprising a portion of the metal layer extending onto the side surface of the first substrate between the at least one metal interconnect and the side surface of the first substrate.

4. The stacked AW filter package of any of clause 1 to clause 3, further comprising:
    at least a second metal interconnect disposed on the side surface of the first substrate; and
    an insulation layer disposed on the side surface of the first substrate between the side surface and the at least a second metal interconnect, the at least a second metal interconnect electrically insulated from the first substrate.

5. The stacked AW filter package of any of clause 1 to clause 4, further comprising a frame disposed between the third surface of the second substrate and the metal layer.

6. The stacked AW filter package of any of clause 1 to clause 5, further comprising:
   a cap substrate disposed on the first surface of the first substrate;
   a second frame disposed between the cap substrate and the first substrate; and
   a contact disposed on the cap substrate;
   wherein the at least one metal interconnect is coupled to the contact.
7. The stacked AW filter package of any of clause 1 to clause 6, wherein the metal layer comprises a patterned metal layer comprising metal disposed on at least a first portion of the second surface of the first substrate and not disposed on at least a second portion of the second surface of the first substrate.
8. The stacked AW filter package of clause 2, wherein the ground pad is further coupled to the first AW filter circuit.
9. The stacked AW filter package of any of clause 1 to clause 8, wherein the metal layer on the second surface of the first substrate further comprises:
   a titanium layer on the second surface of the first substrate; and
   a copper layer on the titanium layer.
10. The stacked AW filter package of any of clause 1 to clause 9 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server, a computer, a portable computer; a mobile computing device; a wearable computing device; a desktop computer, a personal digital assistant (PDA); a monitor; a computer monitor, a television; a tuner, a radio; a satellite radio; a music player; a digital music player; a portable music player; a digital video player; a video player; a digital video disc (DVD) player, a portable digital video player, an automobile; a vehicle component; avionics systems; a drone; and a multicopter.
11. A method for manufacturing a stacked acoustic wave (AW) filter package, the method comprising:
    forming a first AW filter circuit on a first surface of a first substrate;
    forming a metal layer on a second surface of the first substrate;
    forming a second AW filter circuit on a third surface of a second substrate; forming a cavity around the second AW filter circuit between the metal layer and the third surface of the second substrate; and
    forming a metallization layer comprising at least one metal interconnect on a side surface of the first substrate, the at least one metal interconnect coupled to the metal layer, and the second AW filter circuit.
12. The method of clause 11, wherein forming the metallization layer further comprises coupling the at least one metal interconnect to a ground pad coupled to the second AW filter circuit.
13. The method of clause 11 or clause 12, wherein forming the metal layer further comprises forming the metal layer extending onto the side surface of the first substrate between the at least one metal interconnect and the side surface of the first substrate.
14. The method of any of clause 11 to clause 13, further comprising forming an insulation layer on the side surface of the first substrate, wherein forming the metallization layer further comprises forming at least a second metal interconnect on the insulation layer, the second metal interconnect insulated from the first substrate.
15. The method of clause 11 to clause 14, further comprising forming a frame on the third surface of the second substrate.
16. The method of clause 11 to clause 15, further comprising:
    disposing a cap substrate on the first surface of the first substrate; and
    forming a contact on the cap substrate, the contact coupled to the at least one metal interconnect.
17. The method of clause 11 to clause 16, wherein forming the metal layer further comprises patterning the metal layer to dispose the metal layer on at least a first portion of the second surface of the first substrate and not disposed on at least a second portion of the second surface of the first substrate.
18. The method of clause 11 to clause 17, wherein forming the metallization layer further comprises coupling the at least one metal interconnect to the first AW filter circuit on the first substrate.
19. The method of clause 11 to clause 18, wherein forming the metal layer on the second surface of the first substrate further comprises:
    forming a titanium layer on the second surface and the side surface of the first substrate; and
    forming a copper layer on the titanium layer.
20. The method of clause 11 to clause 19, wherein forming the metal layer on the second surface of the first substrate further comprises:
    forming a resist layer on the metal layer,
    dispose a patterned mask on the resist layer;
    develop the resist layer in exposed areas exposed by the patterned mask;
    removing the resist layer from the exposed areas; and
    etch the metal layer from the exposed areas.

What is claimed is:

1. A stacked acoustic wave (AW) filter circuit, comprising:
   a first substrate comprising a first AW filter circuit on a first surface;
   a metal layer on a second surface of the first substrate;
   a second substrate comprising a second AW filter circuit on a third surface, the second AW filter circuit disposed in a cavity between the metal layer on the first substrate and the third surface of the second substrate;
   a metallization layer comprising at least one metal interconnect disposed on a side surface of the first substrate, the at least one metal interconnect coupled to the metal layer, and the second AW filter circuit; and
   a portion of the metal layer extending onto the side surface of the first substrate between the at least one metal interconnect and the side surface of the first substrate.

2. The stacked AW filter package of claim 1, wherein the at least one metal interconnect is coupled to a ground pad coupled to the second AW filter circuit.

3. The stacked AW filter package of claim 2, wherein the ground pad is further coupled to the first AW filter circuit.

4. The stacked AW filter package of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

5. The stacked AW filter package of claim 1, further comprising a frame disposed between the third surface of the second substrate and the metal layer.

6. The stacked AW filter package of claim 1, further comprising:
   a cap substrate disposed on the first surface of the first substrate;
   a second frame disposed between the cap substrate and the first substrate; and
   a contact disposed on the cap substrate;
   wherein the at least one metal interconnect is coupled to the contact.

7. A method for manufacturing a stacked acoustic wave (AW) filter package, the method comprising:
   forming a first AW filter circuit on a first surface of a first substrate;
   forming a metal layer on a second surface of the first substrate;
   forming a second AW filter circuit on a third surface of a second substrate;
   forming a cavity around the second AW filter circuit between the metal layer and the third surface of the second substrate; and
   forming a metallization layer comprising at least one metal interconnect on a side surface of the first substrate; and
   coupling the at least one metal interconnect of the metallization layer to the metal layer and the second AW filter circuit,
   wherein forming the metal layer further comprises forming the metal layer extending onto the side surface of the first substrate between the at least one metal interconnect and the side surface of the first substrate.

8. The method of claim 7, further comprising coupling the at least one metal interconnect of the metallization layer to a ground pad coupled to the second AW filter circuit.

9. The method of claim 7, further comprising forming an insulation layer on the side surface of the first substrate, wherein forming the metallization layer further comprises forming at least a second metal interconnect on the insulation layer, the second metal interconnect insulated from the first substrate.

10. The method of claim 7, further comprising forming a frame on the third surface of the second substrate.

11. The method of claim 7, further comprising:
   disposing a cap substrate on the first surface of the first substrate; and
   forming a contact on the cap substrate, the contact coupled to the at least one metal interconnect.

12. The method of claim 7, wherein forming the metal layer further comprises patterning the metal layer to dispose the metal layer on at least a first portion of the second surface of the first substrate and not disposed on at least a second portion of the second surface of the first substrate.

13. The method of claim 7, wherein forming the metallization layer further comprises coupling the at least one metal interconnect to the first AW filter circuit on the first substrate.

14. The method of claim 7, wherein forming the metal layer on the second surface of the first substrate further comprises:
   forming a titanium layer on the second surface and the side surface of the first substrate; and
   forming a copper layer on the titanium layer.

15. The method of claim 7, wherein forming the metal layer on the second surface of the first substrate further comprises:
   forming a resist layer on the metal layer;
   dispose a patterned mask on the resist layer;
   develop the resist layer in exposed areas exposed by the patterned mask;
   removing the resist layer from the exposed areas; and
   etch the metal layer from the exposed areas.

16. A stacked acoustic wave (AW) filter circuit, comprising:
   a first substrate comprising a first AW filter circuit on a first surface;
   a metal layer on a second surface of the first substrate;
   a second substrate comprising a second AW filter circuit on a third surface, the second AW filter circuit disposed in a cavity between the metal layer on the first substrate and the third surface of the second substrate; and
   a metallization layer comprising at least one metal interconnect disposed on a side surface of the first substrate, the at least one metal interconnect coupled to the metal layer, and the second AW filter circuit;
   at least a second metal interconnect disposed on the side surface of the first substrate; and
   an insulation layer disposed on the side surface of the first substrate between the side surface and the at least a second metal interconnect, the at least a second metal interconnect electrically insulated from the first substrate.

17. The stacked AW filter package of claim 16, wherein the at least one metal interconnect is coupled to a ground pad coupled to the second AW filter circuit.

18. The stacked AW filter package of claim 17, wherein the ground pad is further coupled to the first AW filter circuit.

19. The stacked AW filter package of claim 16, further comprising a frame disposed between the third surface of the second substrate and the metal layer.

20. The stacked AW filter package of claim 16, further comprising:
   a cap substrate disposed on the first surface of the first substrate;
   a second frame disposed between the cap substrate and the first substrate; and
   a contact disposed on the cap substrate;
   wherein the at least one metal interconnect is coupled to the contact.

21. A stacked acoustic wave (AW) filter circuit, comprising:
   a first substrate comprising a first AW filter circuit on a first surface;
   a metal layer on a second surface of the first substrate;
   a second substrate comprising a second AW filter circuit on a third surface, the second AW filter circuit disposed in a cavity between the metal layer on the first substrate and the third surface of the second substrate; and a metallization layer comprising at least one metal interconnect disposed on a side surface of the first substrate, the at least one metal interconnect coupled to the metal layer, and the second AW filter circuit, wherein the metal layer comprises a patterned metal layer comprising metal disposed on at least a first portion of the second surface of the first substrate and not disposed on at least a second portion of the second surface of the first substrate.

22. The stacked AW filter package of claim 21, wherein the at least one metal interconnect is coupled to a ground pad coupled to the second AW filter circuit.

23. The stacked AW filter package of claim 22, wherein the ground pad is further coupled to the first AW filter circuit.

24. The stacked AW filter package of claim 21, further comprising a frame disposed between the third surface of the second substrate and the metal layer.

25. The stacked AW filter package of claim 21, further comprising:
 a cap substrate disposed on the first surface of the first substrate;
 a second frame disposed between the cap substrate and the first substrate; and
 a contact disposed on the cap substrate;
 wherein the at least one metal interconnect is coupled to the contact.

26. A stacked acoustic wave (AW) filter circuit, comprising:
 a first substrate comprising a first AW filter circuit on a first surface;
 a metal layer on a second surface of the first substrate;
 a second substrate comprising a second AW filter circuit on a third surface, the second AW filter circuit disposed in a cavity between the metal layer on the first substrate and the third surface of the second substrate; and
 a metallization layer comprising at least one metal interconnect disposed on a side surface of the first substrate, the at least one metal interconnect coupled to the metal layer, and the second AW filter circuit,
 wherein the metal layer on the second surface of the first substrate further comprises:
  a titanium layer on the second surface of the first substrate; and
  a copper layer on the titanium layer.

27. The stacked AW filter package of claim 26, wherein the at least one metal interconnect is coupled to a ground pad coupled to the second AW filter circuit.

28. The stacked AW filter package of claim 27, wherein the ground pad is further coupled to the first AW filter circuit.

29. The stacked AW filter package of claim 26, further comprising a frame disposed between the third surface of the second substrate and the metal layer.

30. The stacked AW filter package of claim 26, further comprising:
 a cap substrate disposed on the first surface of the first substrate;
 a second frame disposed between the cap substrate and the first substrate; and
 a contact disposed on the cap substrate;
 wherein the at least one metal interconnect is coupled to the contact.

* * * * *